US010643863B2

(12) United States Patent
Yen et al.

(10) Patent No.: US 10,643,863 B2
(45) Date of Patent: May 5, 2020

(54) SEMICONDUCTOR PACKAGE AND METHOD OF MANUFACTURING THE SAME

(71) Applicant: Advanced Semiconductor Engineering, Inc., Kaohsiung (TW)

(72) Inventors: You-Lung Yen, Kaohsiung (TW); Kuang-Hsiung Chen, Kaohsiung (TW); Shing-Cheng Liang, Kaohsiung (TW); Pei-Yu Hsu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/685,864

(22) Filed: Aug. 24, 2017

(65) Prior Publication Data

US 2019/0067036 A1 Feb. 28, 2019

(51) Int. Cl.
*H01L 23/48* (2006.01)
*H01L 21/50* (2006.01)
(Continued)

(52) U.S. Cl.
CPC ............ *H01L 21/56* (2013.01); *H01L 21/561* (2013.01); *H01L 21/6835* (2013.01); *H01L 23/3107* (2013.01); *H01L 23/3121* (2013.01); *H01L 23/3135* (2013.01); *H01L 23/3171* (2013.01); *H01L 23/4824* (2013.01); *H01L 24/01* (2013.01); *H01L 24/83* (2013.01); *H01L 24/96* (2013.01); *H01L 24/97* (2013.01); *H01L 24/03* (2013.01); *H01L 24/05* (2013.01); *H01L 24/11* (2013.01); *H01L 24/13* (2013.01); *H01L 24/16* (2013.01); *H01L 24/20* (2013.01); *H01L 2221/68359* (2013.01);
(Continued)

(58) Field of Classification Search
CPC ..... H01L 23/3192; H01L 24/02; H01L 24/11; H01L 24/12; H01L 24/94; H01L 2224/0401; H01L 2224/13022; H01L 2224/13099; H01L 2224/16; H01L 2224/274; H01L 2924/01013; H01L 2924/01014; H01L 2924/01022; H01L 2924/01028
See application file for complete search history.

(56) References Cited

U.S. PATENT DOCUMENTS 5,863,355 A * 1/1999 Ohno ................ B23K 35/3613 106/1.13
5,877,078 A * 3/1999 Yanagida ................ H01L 24/03 257/E21.508
(Continued)

FOREIGN PATENT DOCUMENTS

TW I251019 B 3/2006

*Primary Examiner* — Brian Turner
(74) *Attorney, Agent, or Firm* — Foley & Lardner LLP

(57) ABSTRACT

A semiconductor package includes a die and a patterned conductive layer electrically connected to the die. The patterned conductive layer includes a connection pad and a trace. The semiconductor package further includes an encapsulation layer encapsulating the die and the patterned conductive layer. The semiconductor package further includes an electrical connection element disposed on the connection pad and a protection layer including a sidewall portion surrounding the electrical connection element.

23 Claims, 16 Drawing Sheets

(51) Int. Cl.

| | |
|---|---|
| ***H01L 21/56*** | (2006.01) |
| ***H01L 21/768*** | (2006.01) |
| ***H01L 23/31*** | (2006.01) |
| ***H01L 23/498*** | (2006.01) |
| ***H01L 23/00*** | (2006.01) |
| ***H01L 23/482*** | (2006.01) |
| ***H01L 21/683*** | (2006.01) |

(52) U.S. Cl.

CPC ............... *H01L 2224/03464* (2013.01); *H01L 2224/03849* (2013.01); *H01L 2224/0401* (2013.01); *H01L 2224/05025* (2013.01); *H01L 2224/05571* (2013.01); *H01L 2224/05611* (2013.01); *H01L 2224/05644* (2013.01); *H01L 2224/05655* (2013.01); *H01L 2224/10126* (2013.01); *H01L 2224/11849* (2013.01); *H01L 2224/12105* (2013.01); *H01L 2224/13111* (2013.01); *H01L 2224/16227* (2013.01); *H01L 2224/16235* (2013.01); *H01L 2224/94* (2013.01); *H01L 2224/96* (2013.01); *H01L 2225/06548* (2013.01); *H01L 2924/0002* (2013.01); *H01L 2924/151* (2013.01); *H01L 2924/1579* (2013.01); *H01L 2924/15311* (2013.01); *H01L 2924/3511* (2013.01); *H01L 2924/3512* (2013.01); *H01L 2924/35121* (2013.01)

(56) References Cited

U.S. PATENT DOCUMENTS 5,904,782 A * 5/1999 Diep-Quang ...... B23K 35/3618 148/23
5,976,912 A 11/1999 Fukutomi et al.
7,888,411 B2 2/2011 Wrosch et al.
8,362,612 B1 * 1/2013 Paek ................... H01L 23/3192 257/737
2003/0201309 A1 * 10/2003 Grigg ..................... B23K 1/203 228/207
2004/0129344 A1 * 7/2004 Arita .................. B23K 35/0222 148/23
2005/0082670 A1 * 4/2005 Quinones .............. H01L 21/563 257/737
2005/0224966 A1 * 10/2005 Fogel ...................... H01L 24/03 257/737
2005/0253261 A1 * 11/2005 Farnworth .......... H01L 23/3114 257/734
2005/0276934 A1 * 12/2005 Fukui ................... C08G 65/329 428/32.6
2006/0038291 A1 * 2/2006 Chung ................ H01L 23/3114 257/738
2006/0043364 A1 * 3/2006 Jiang ................... H01L 23/3114 257/48
2006/0194920 A1 8/2006 Capote et al.
2007/0018322 A1 * 1/2007 Park .................... H01L 23/3192 257/738
2007/0182004 A1 * 8/2007 Rinne ................ H01L 23/3114 257/734
2007/0261883 A1 * 11/2007 Chan ...................... C08G 59/68 174/259
2007/0296065 A1 * 12/2007 Yew .................... H01L 23/5389 257/659
2010/0200972 A1 * 8/2010 Lin ..................... H01L 23/3114 257/676
2011/0278736 A1 * 11/2011 Lin ......................... H01L 25/50 257/774
2013/0187285 A1 * 7/2013 Chang ..................... H01L 24/19 257/774
2013/0249106 A1 * 9/2013 Lin ......................... H01L 24/19 257/774
2014/0042600 A1 * 2/2014 Kim .................... H01L 23/3135 257/666
2014/0077361 A1 * 3/2014 Lin ......................... H01L 22/14 257/737
2014/0106507 A1 * 4/2014 Meyer ................. G03F 7/70991 438/107
2014/0191382 A1 * 7/2014 Asami ..................... H01L 24/81 257/676
2014/0264846 A1 * 9/2014 Chen ................. H01L 21/76885 257/737
2016/0093580 A1 * 3/2016 Scanlan .................. H01L 23/48 257/737
2017/0345794 A1 * 11/2017 Yu ........................... H01L 25/50

* cited by examiner

SEMICONDUCTOR PACKAGE AND METHOD OF MANUFACTURING THE SAME

TECHNICAL FIELD

The present disclosure generally relates to a semiconductor package, and to a method of manufacturing the same.

BACKGROUND

In a semiconductor device package, there can be an interface between a substrate and a molding compound. Mismatches of respective coefficients of thermal expansion (CTEs) between the substrate and the molding compound can cause warpage to the semiconductor device package during thermal treatment, and thus the substrate may be separated from the molding compound during thermal treatment.

In the semiconductor device package, a protection layer may be provided on the substrate before a soldering ball is mounted. Portions of the protection layers may be removed to expose connection pads of the substrate, so that they may receive solder balls for external connection. This approach may also involve an additional process for removing the protection layer, which can increase a cost or processing time for manufacture of the semiconductor device package.

SUMMARY

In some embodiments, according to one aspect, a semiconductor package includes a die and a patterned conductive layer electrically connected to the die, the patterned conductive layer including a connection pad and a trace. The semiconductor package further includes an encapsulation layer encapsulating the die and the patterned conductive layer, and an electrical connection element disposed on the connection pad. The semiconductor package further includes a protection layer including a sidewall portion surrounding the electrical connection element.

In some embodiments, according to another aspect, a method of manufacturing a semiconductor package includes forming a patterned conductive layer including a connection pad on a carrier and electrically connecting a die to the patterned conductive layer. The method further includes forming an encapsulation layer that encapsulates the die and the patterned conductive layer, and removing the carrier to expose the connection pad of the patterned conductive layer. The method further includes forming a coating layer on the connection pad, forming an electrical connection element on the coating layer, and heating the coating layer to form a protection layer on the electrical connection element. The protection layer includes a sidewall portion surrounding the electrical connection element.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

DETAILED DESCRIPTION

Figure 1A:
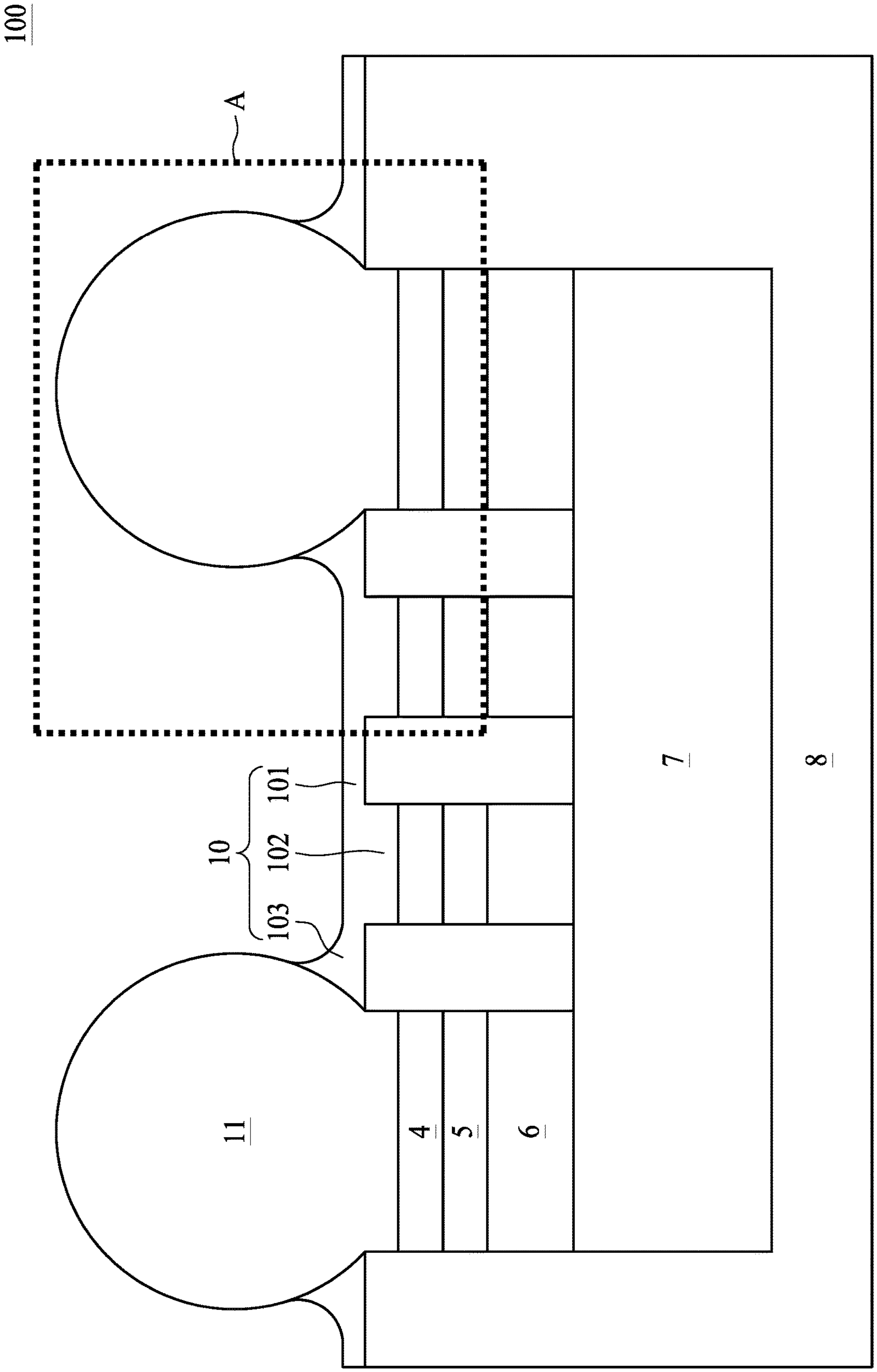
FIG. 1A is a schematic diagram illustrating a cross-sectional view of a semiconductor die package according to some embodiments of the present disclosure.

Embodiments of the present disclosure and use thereof are discussed in detail below. It should be appreciated, however, that the embodiments set forth many applicable concepts that can be embodied in a wide variety of specific contexts. It is to be understood that the following disclosure provides many different embodiments or examples of implementing different features of various embodiments. Specific examples of components and arrangements are described below for purposes of discussion. These are, of course, merely examples and are not intended to be limiting.

Spatial descriptions, including such terms as "above," "below," "up," "left," "right," "down," "top," "bottom," "vertical," "horizontal," "side," "higher," "lower," "upper," "over," "under," and so forth, are used herein with respect to an orientation shown in corresponding figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Embodiments, or examples, illustrated in the figures are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed herein.

The present disclosure provides for a packaging method and a packaging structure. In the method and structure described herein, lamination of a dielectric material on a substrate may be omitted and thus a cost for manufacturing the packaging structure may be reduced. Embodiments of methods disclosed in the present disclosure can increase a substrate yield and can also provide for a reduced overall thickness of a package. In addition, reliability of a package manufactured using the method disclosed in the present disclosure can be enhanced.

FIG. 1A is a schematic diagram illustrating a cross-sectional view of a semiconductor die package according to some embodiments of the present disclosure. As shown in FIG. 1A, the semiconductor die package 100 comprises a patterned conductive layer 4, a solder material 5, a conductive pillar 6, a die 7, an encapsulation layer 8, a protection layer 10 and an electrical connection element 11.

The encapsulation layer 8 encapsulates the patterned conductive layer 4, the solder material 5, the conductive pillar 6, the die 7, at least a portion of the protection layer 10 and at least a portion of the electrical connection element 11. An active surface of the die 7 is electrically connected to the conductive pillar 6. Although not illustrated, in some embodiments one or more conductive pads (not shown in FIG. 1) may be disposed on the active surface of the die 7 for connection to the conductive pillar 6.

The solder material 5 is disposed on the conductive pillar 6. The solder material 5 is disposed between the patterned conductive layer 4 and the conductive pillar 6. The patterned conductive layer 4 is disposed on the solder material 5. The patterned conductive layer 4 may include one or more connection pads and/or one or more traces.

The electrical connection element 11 is disposed on the patterned conductive layer 4 for external connection. The electrical connection element 11 may include, for example, a material similar to, or the same as, a material included in the solder material 5. A portion of the electrical connection element 11 is encapsulated by the encapsulation layer 8. A portion of the electrical connection element 11 is embedded in the encapsulation layer 8. The electrical connection element 11 may include a first portion disposed in the encapsulation layer 8 and a second portion that is round, curved, spherical or ball-shaped exposed by (e.g. protruding from) the encapsulation layer 8.

The protection layer 10 covers a surface of the encapsulation layer 8. The protection layer 10 includes a portion 101, a portion 102, and a sidewall portion 103. The portion 101 covers an upper surface of the encapsulation layer 8. The portion 101 of the protection layer 10 has a thickness in a range of about 5 micrometers ("μm") to about 15 μm, or a thickness in a range of about 2 μm to about 15 μm.

The sidewall portion 103 covers a surface of the encapsulation layer 8. The sidewall portion 103 may include a lateral surface of the portion 102. The sidewall portion 103 may be a portion of the protection layer 10 that contacts the electrical connection element 11. The sidewall portion 103 may have a curved or arc shape (e.g. a curved shape that complements the second portion of the electrical connection element 11). In other embodiments, the sidewall portion 103 may be any shape that complements the electrical connection element 11. The sidewall portion 103 surrounds the second portion of the electrical connection element 11. The sidewall portion 103 surrounds the electrical connection element 11. The sidewall portion 103 of the protection layer 10 is disposed above the first portion of the electrical connection element 11 within the encapsulation layer 8 and below at least a portion of the second portion of the electrical connection element 11 exposed by the encapsulation layer 8.

At least a portion of the portion 102 of the protection layer 10 is surrounded by the encapsulation layer 8. At least a portion of the portion 102 of the protection layer 10 is embedded in the encapsulation layer 8. The portion 102 may be disposed between the portion 101 and the sidewall portion 103. An upper surface of the portion 102 may be substantially coplanar with an upper surface of the portion 101.

Figure 1B:
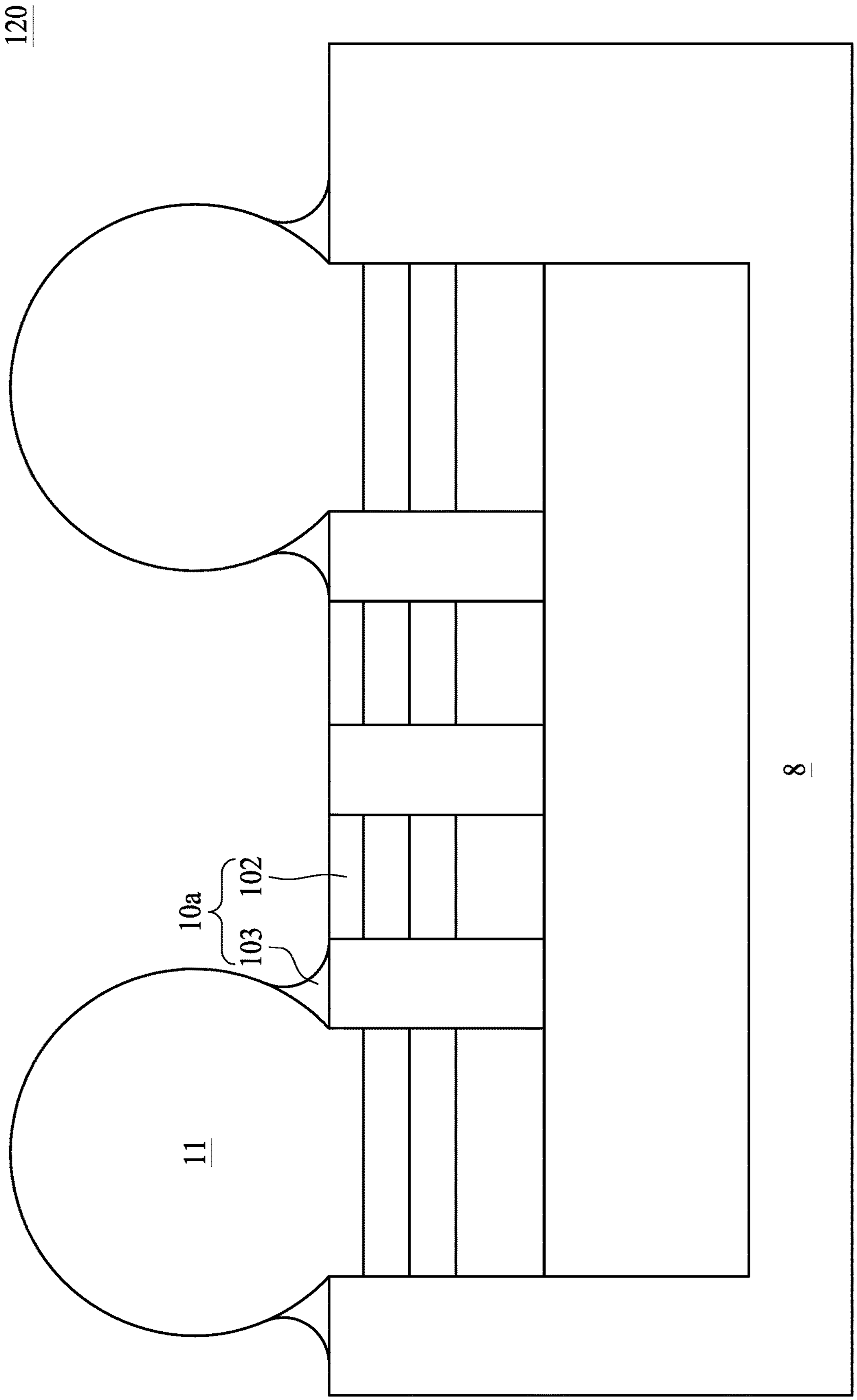
FIG. 1B is a schematic diagram illustrating a cross-sectional view of a semiconductor die package according to some embodiments of the present disclosure.

FIG. 1B is a schematic diagram illustrating a cross-sectional view of a semiconductor die package according to some embodiments of the present disclosure. The semiconductor die package 120 shown in FIG. 1B is similar to the semiconductor die package 100 shown in FIG. 1A, except that a protection layer 10*a* is implemented instead of the protection layer 10. The protection layer 10*a* is similar to the protection layer 10, but omits the portion 101 of the protection layer 10 (e.g. at least a portion of the upper surface of the encapsulation layer 8 is exposed from the protection layer 10*a*). In one or more embodiments, the upper surface of the portion 102 is substantially coplanar with the upper surface of the encapsulation layer 8.

Figure 1C:
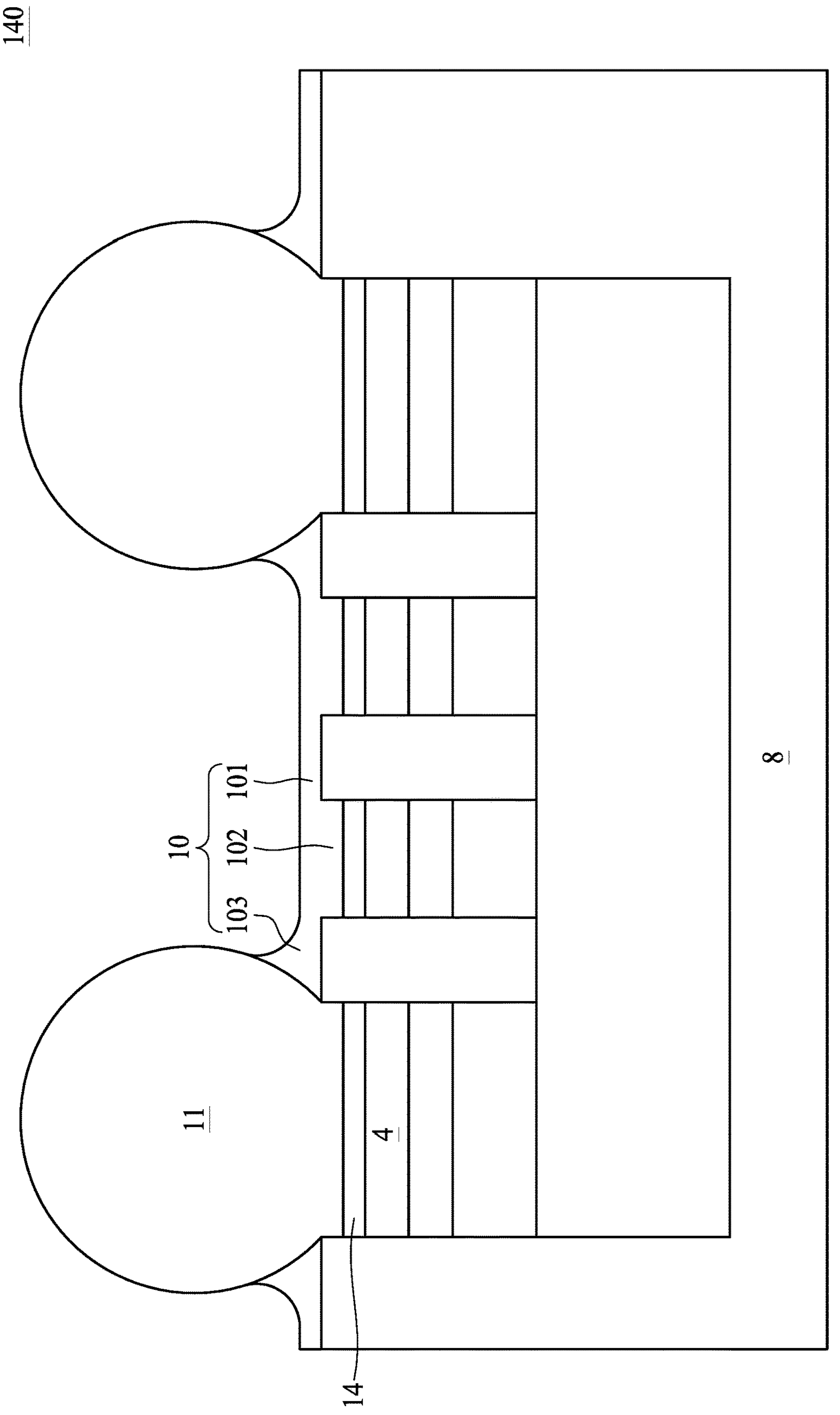
FIG. 1C is a schematic diagram illustrating a cross-sectional view of a semiconductor die package according to some embodiments of the present disclosure.

FIG. 1C is a schematic diagram illustrating a cross-sectional view of a semiconductor die package according to some embodiments of the present disclosure. The semiconductor die package 140 shown in FIG. 1C is similar to the semiconductor die package 100 shown in FIG. 1A, except that an antioxidant conductive layer 14 is disposed on the patterned conductive layer 4. The antioxidant conductive layer 14 is disposed between the patterned conductive layer 4 and the electrical connection element 11. The antioxidant conductive layer 14 is disposed between the patterned conductive layer 4 and the protection layer 10. The antioxidant conductive layer 14 includes a material different from a material included in the electrical connection element 11 (e.g. includes electroless nickel immersion gold (ENIG) or other suitable materials).

Figure 1D:
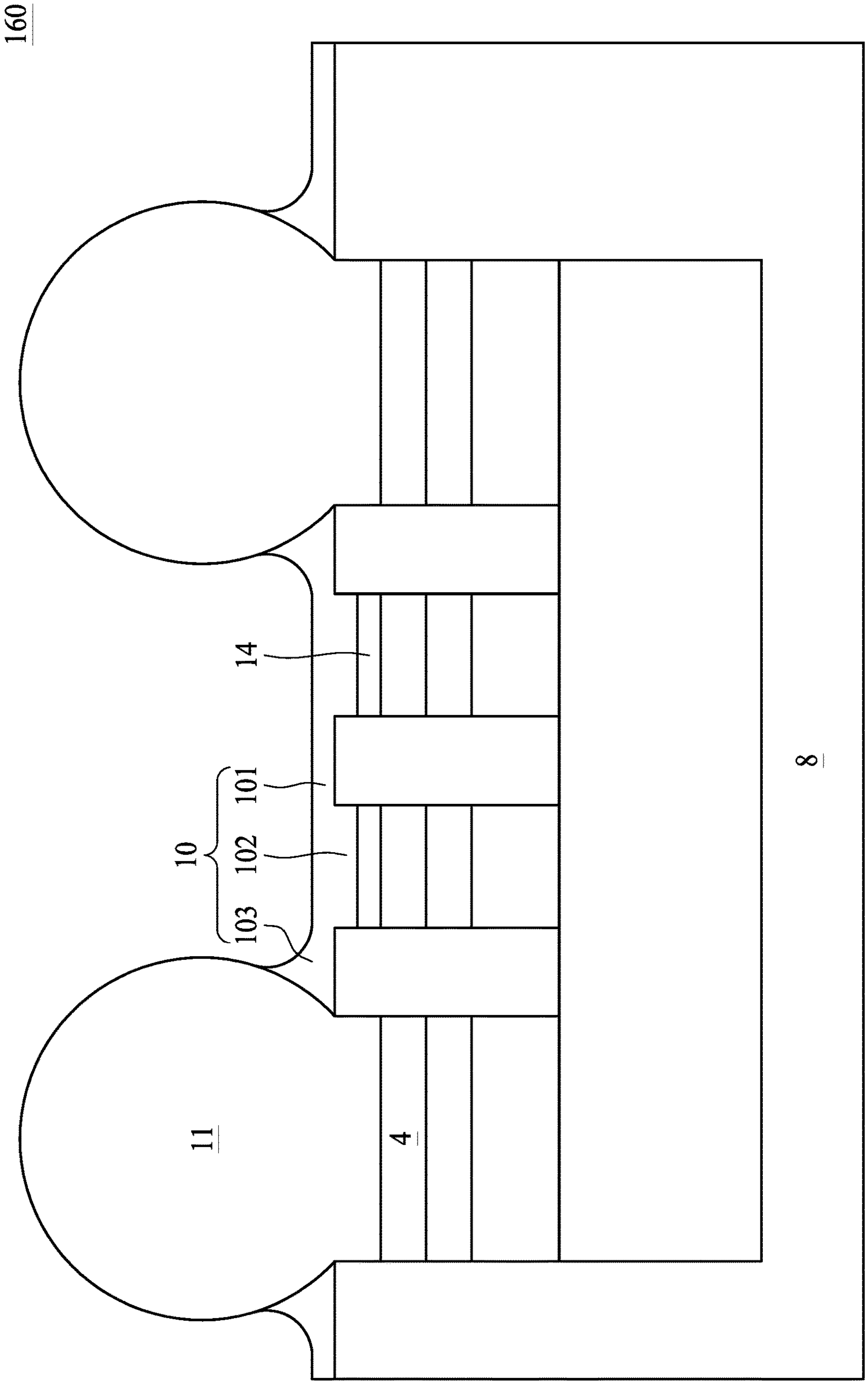
FIG. 1D is a schematic diagram illustrating a cross-sectional view of a semiconductor die package according to some embodiments of the present disclosure.

FIG. 1D is a schematic diagram illustrating a cross-sectional view of a semiconductor die package according to some embodiments of the present disclosure. The semiconductor die package 160 shown in FIG. 1D is similar to the semiconductor die package 140 shown in FIG. 1C, except that a portion of the antioxidant conductive layer 14 disposed between the patterned conductive layer 4 and the electrical connection element 11 is omitted (e.g. the electrical connection element 11 is in direct contact with the patterned conductive layer 4). The antioxidant conductive layer 14 includes a material similar to, or the same as, a material included in the electrical connection element 11 (e.g. includes solder material such as tin (Sn), another metal, or other suitable materials).

Figure 1E:
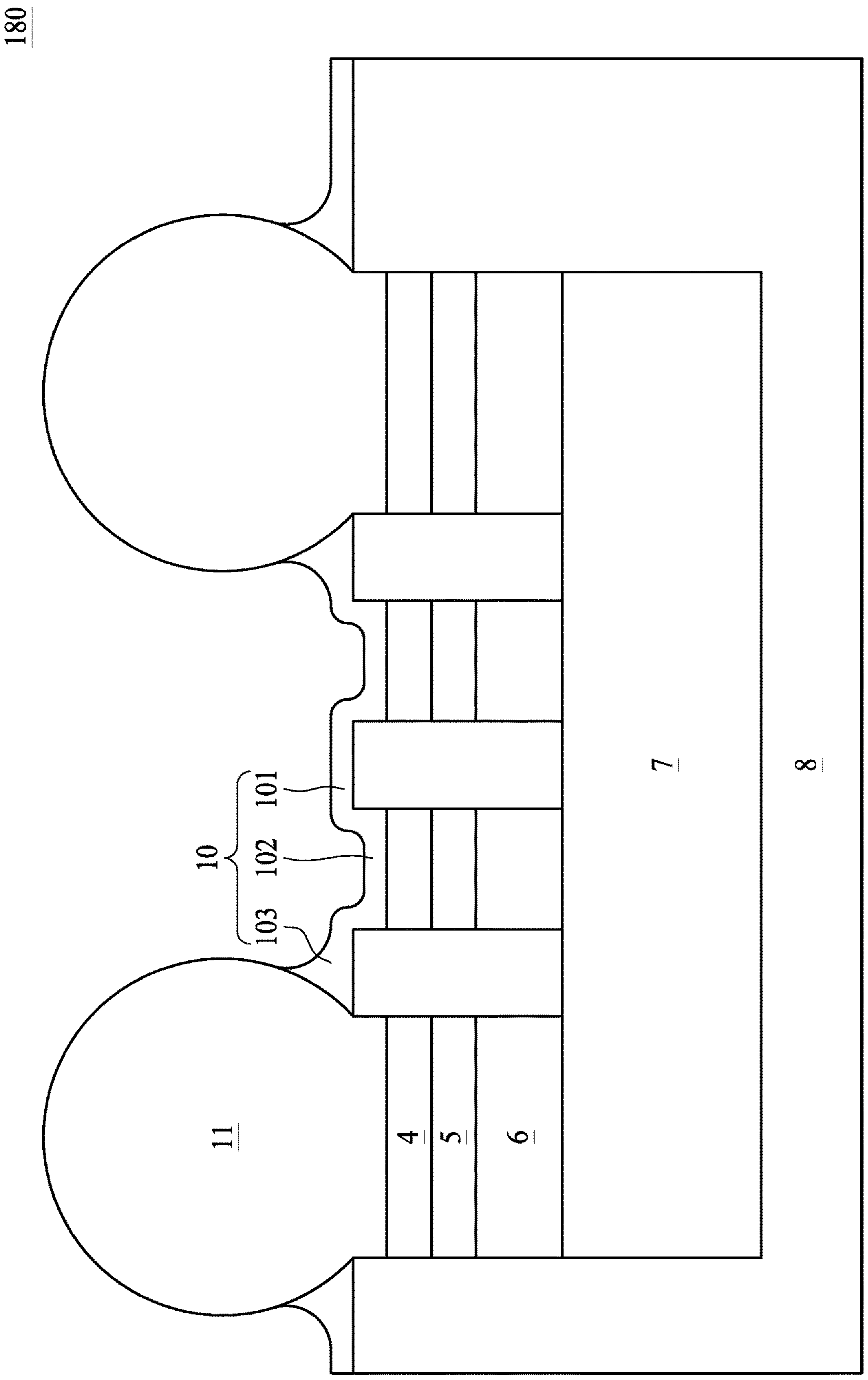
FIG. 1E is a schematic diagram illustrating a cross-sectional view of a semiconductor die package according to some embodiments of the present disclosure.

FIG. 1E is a schematic diagram illustrating a cross-sectional view of a semiconductor die package according to some embodiments of the present disclosure. The semiconductor die package 180 shown in FIG. 1E is similar to the semiconductor die package 100 shown in FIG. 1A, except that the upper surface of the portion 102 of the protection layer 10 is not substantially coplanar with the upper surface of the portion 101 of the protection layer 10. In addition, the upper surface of the portion 102 of the protection layer 10 is disposed below (e.g. is recessed from) the upper surface of the encapsulation layer 8. The portions 101 and 102 of the protection layer 10 have a thickness in a range of about 5 μm to about 15 μm, or a thickness in a range of about 2 μm to about 15 μm.

Figure 1F:
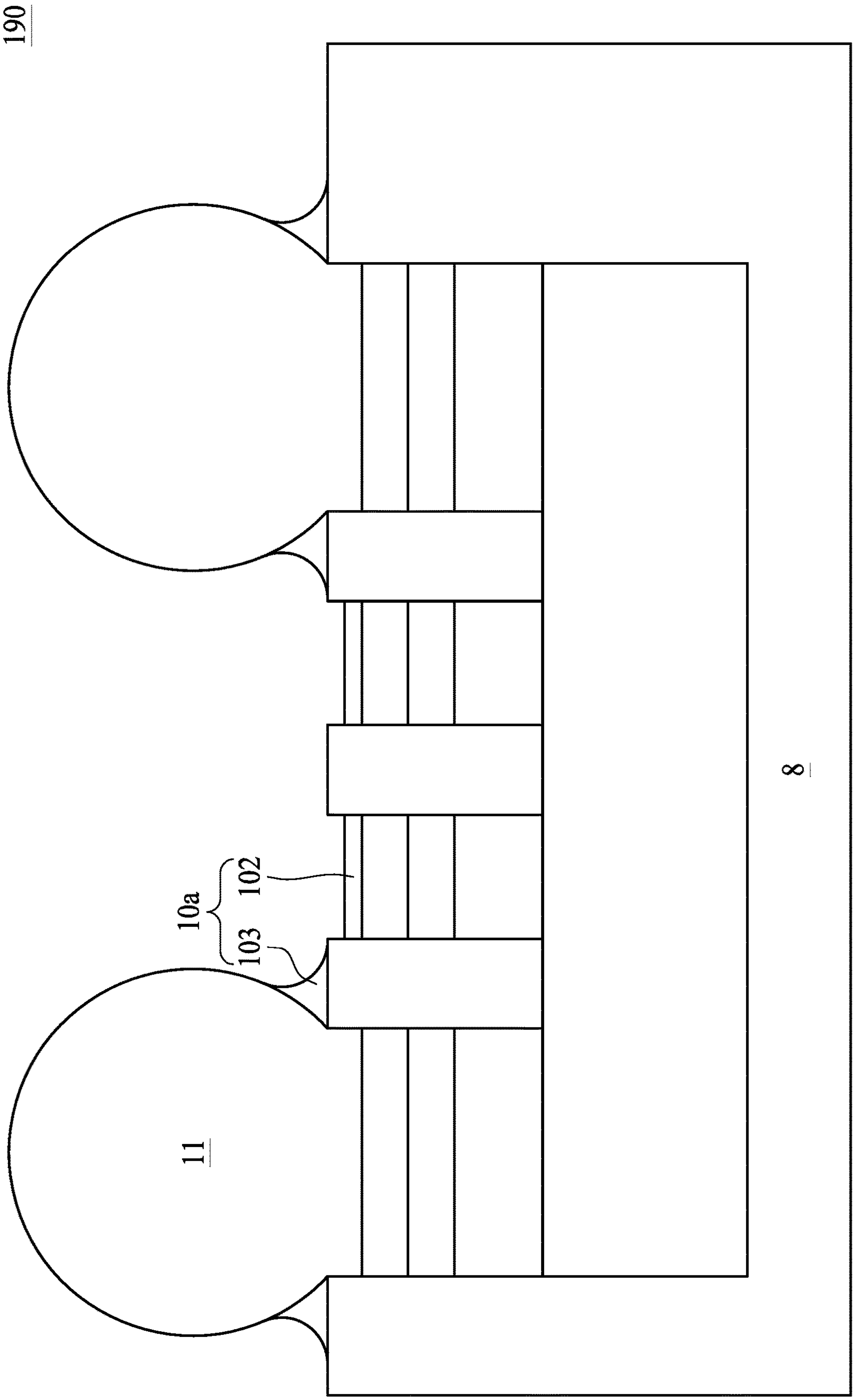
FIG. 1F is a schematic diagram illustrating a cross-sectional view of a semiconductor die package according to some embodiments of the present disclosure.

FIG. 1F is a schematic diagram illustrating a cross-sectional view of a semiconductor die package according to some embodiments of the present disclosure. The semiconductor die package 190 shown in FIG. 1F is similar to the semiconductor die package 120 shown in FIG. 1B, except that the portion 102 of the protection layer 10 is not substantially coplanar with the upper surface of the encapsulation layer 8, and is recessed below the upper surface of the encapsulation layer 8. The portion 102 of the protection layer 10 has a thickness in a range of about 5 μm to about 15 μm, or a thickness in a range of about 2 μm to about 15 μm.

Figure 2A:
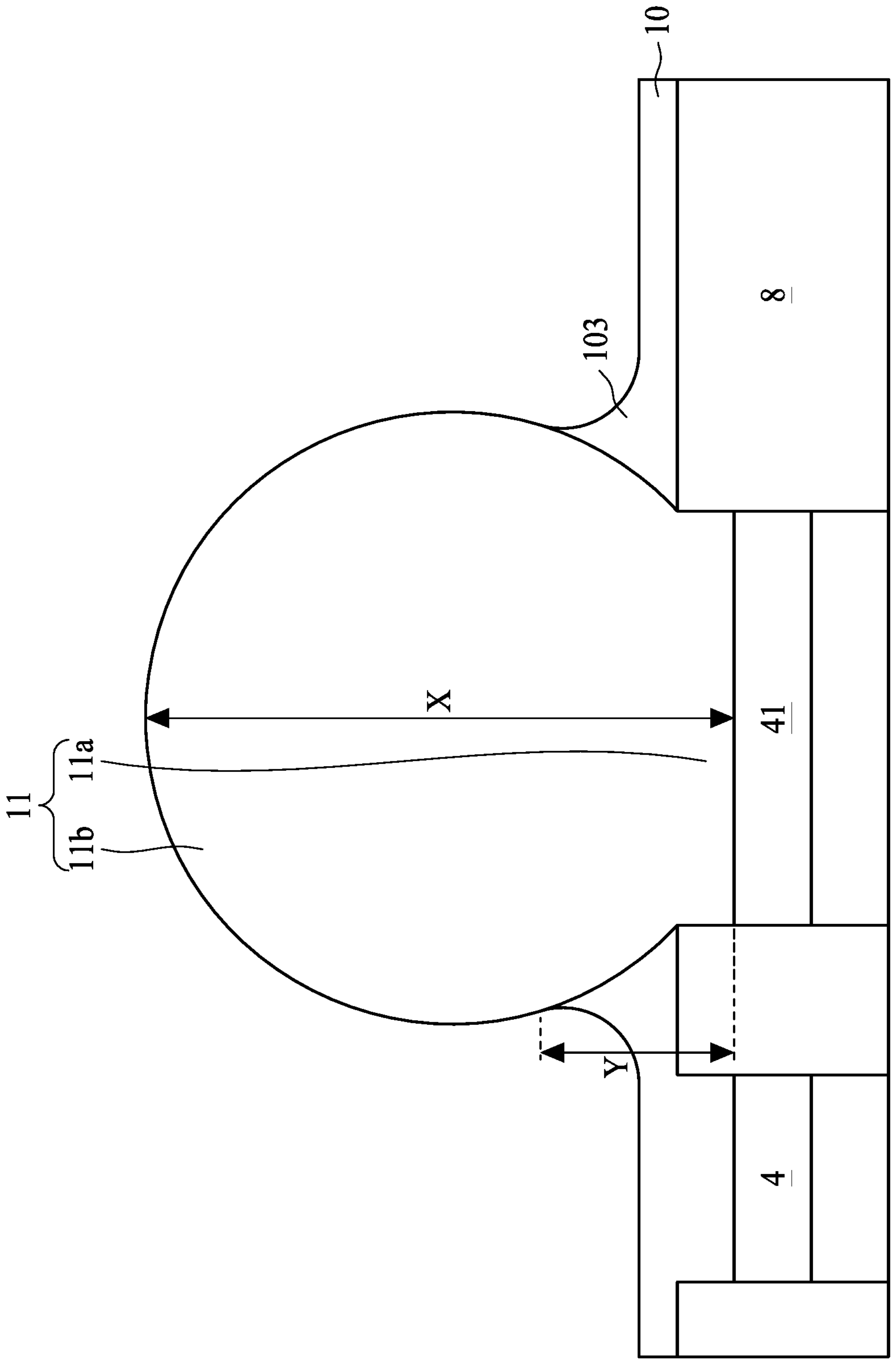
FIG. 2A is a schematic diagram illustrating a cross-sectional view of a semiconductor die package according to some embodiments of the present disclosure.

FIG. 2A is a schematic diagram illustrating a cross-sectional view of a semiconductor die package according to some embodiments of the present disclosure. FIG. 2A illustrates an enlarged view of the structure in the dotted box A shown in FIG. 1A. As shown in FIG. 2A, the electrical connection element 11 includes a portion 11*a* and a portion 11*b*, which can respectively correspond to the above described first portion and second portion. The portion 11*a* is embedded in the encapsulation layer 8 and the protection layer 10 (e.g. the sidewall portion 103 of the protection layer 10) is disposed against the portion 11*b* and surrounds a portion of (e.g. a lower portion of) the portion 11*b*. In the embodiments shown in FIG. 2A, the portion 11*b* is curved and shaped as at least a portion of a ball (e.g. is in a substantially ball shape). The patterned conductive layer 4 includes a connection pad 41 on which the electrical connection element 11 is disposed.

As shown in FIG. 2A, a maximum distance between the portion 11*b* and the patterned conductive layer 4 (e.g. between a top portion of the portion 11*b* and a top surface of the patterned conductive layer 4) is a referred to as a distance X and a maximum distance between the sidewall portion 103 and the patterned conductive layer 4 (e.g. between a top portion of the sidewall portion 103 and the top surface of the patterned conductive layer 4) is a referred to as a distance Y. In some embodiments, the distance Y is less than or equal to about half of the distance X, such as less than or equal to about one third, or less than or equal to about one fourth. As will be discussed below in reference to FIG. 3J, the sidewall portion 103 can be formed after a coating material on the connection pad 41 is pushed away by the electrical connection element 11. The distance Y may depend on an amount of coating material disposed on the encapsulation layer 8 during manufacture.

An electrical connection between the electrical connection element 11 and external components may fail or may be suboptimal if the sidewall portion 103 covers too much of the outer surface of the electrical connection element 11. In some embodiments, the amount of coating material disposed on the encapsulation layer 8 during manufacture is selected such that the distance Y is less than or equal to about half of the distance X.

Figure 2B:
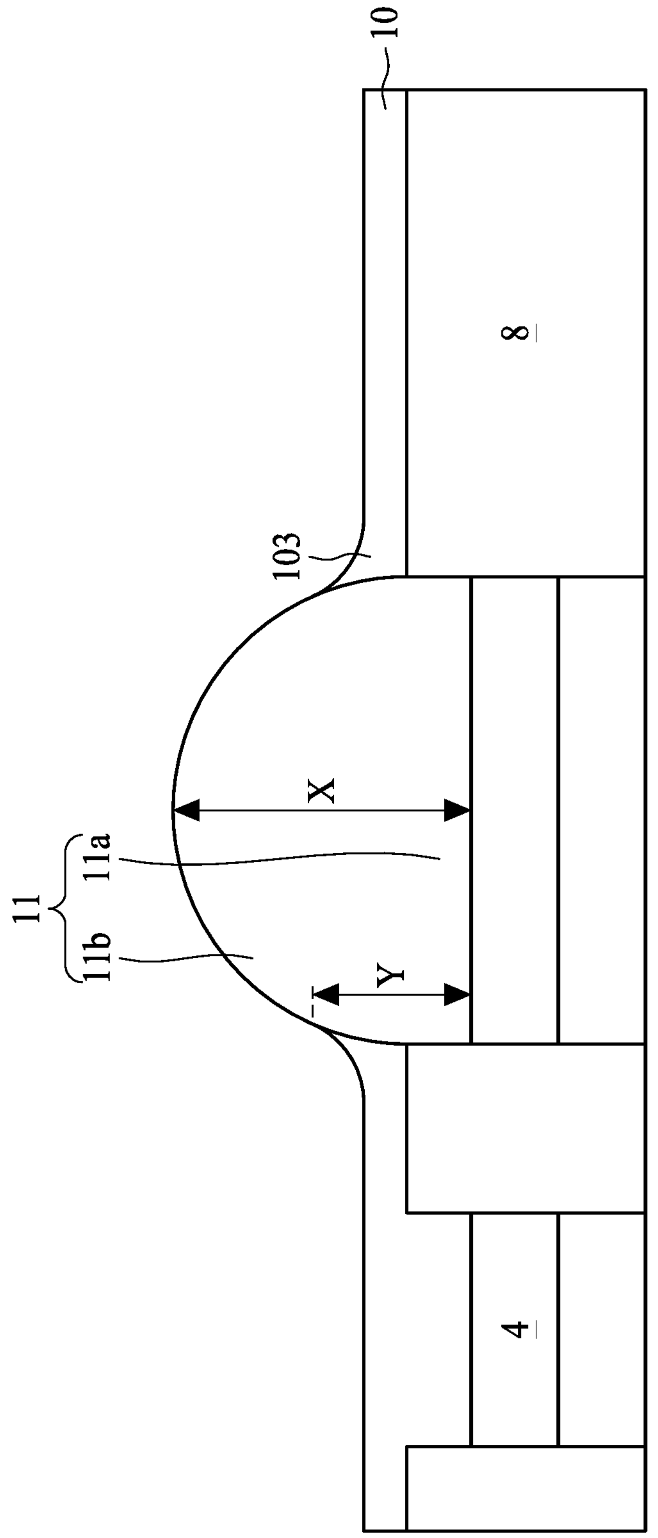
FIG. 2B is a schematic diagram illustrating a cross-sectional view of a semiconductor die package according to some embodiments of the present disclosure.

FIG. 2B is a schematic diagram illustrating a cross-sectional view of a semiconductor die package according to some embodiments of the present disclosure. FIG. 2B provides an enlarged view of the structure in the rectangle A shown in FIG. 1A according to some embodiments of the present disclosure. In the embodiments shown in FIG. 2B, the portion 11*b* is curved and shaped as at least a portion of a ball (e.g. is substantially in a hemisphere shape). The maximum distance between the portion 11*b* and the patterned conductive layer 4 (e.g. between the top portion of the portion 11*b* and the top surface of the patterned conductive layer 4) is referred to as a distance X and the maximum distance between the sidewall portion 103 and the patterned conductive layer 4 (e.g. between the top portion of the sidewall portion 103 and the top surface of the patterned conductive layer 4) is referred to as a distance Y. In some embodiments, the distance Y is less than or equal to about half of the distance X. In some embodiments, as discussed below, the amount of coating material disposed on the encapsulation layer 8 during manufacture is selected such that the distance Y is less than or equal to about half of the distance X.

Figure 3A:
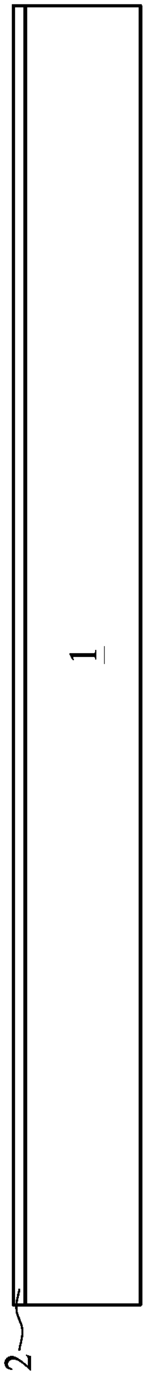
FIG. 3A, FIG. 3B, FIG. 3C, FIG. 3D, FIG. 3E, FIG. 3F, FIG. 3G, FIG. 3H, FIG. 3I, and FIG. 3J illustrate a method of manufacturing a semiconductor package according to some embodiments of the present disclosure.
Figure 3B:
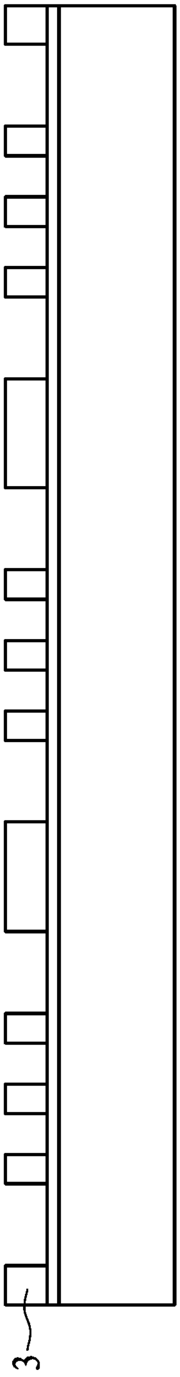

FIG. 3A through FIG. 3J illustrate a method of manufacturing a semiconductor package according to some embodiments of the present disclosure. As shown in FIG. 3A, a carrier 1 is provided, and a conductive layer 2 is disposed on an upper surface of the carrier 1. The conductive layer 2 may include conductive material such as copper (Cu), other metals, or other suitable material. As shown in FIG. 3B, a patterned photoresist layer 3 is provided (e.g. formed) on the conductive layer 2. The patterned photoresist layer 3 may include a dry-film photoresist formed using a lamination process and an exposure process.

Figure 3C:
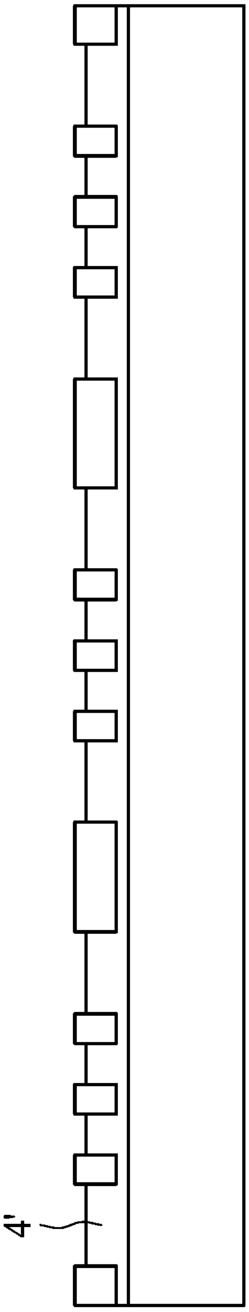

As shown in FIG. 3C, a conductive material is electroplated on portions of the conductive layer 2 that are not covered by the patterned photoresist layer 3, so as to produce a patterned conductive layer 4'. The conductive material electroplated on the conductive layer 2 may include a material similar to, or the same as, a material included in the conductive layer 2. In that case, there may be substantially no interface between the conductive layer 2 and the patterned conductive layer 4'.

Figure 3D:
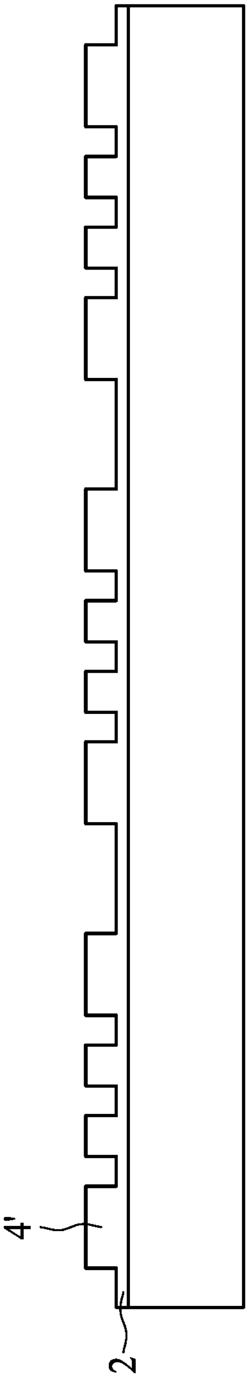
Figure 3E:
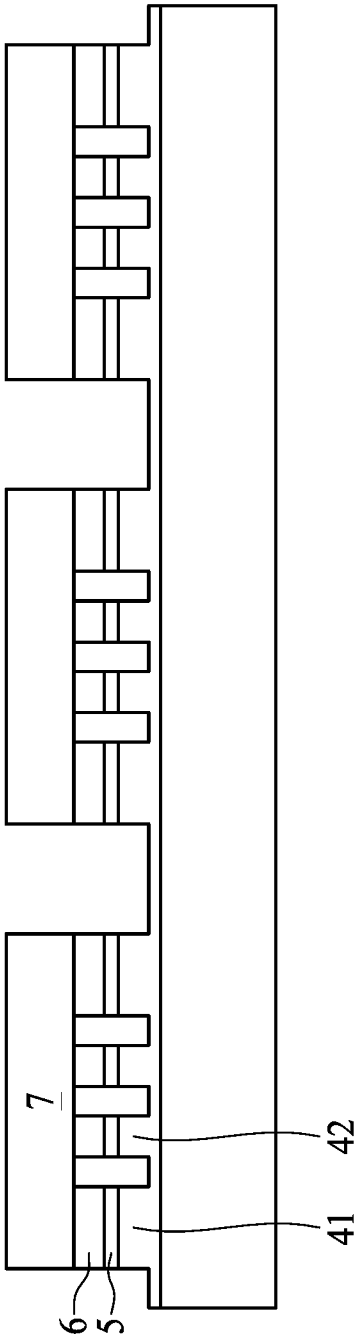
Figure 3F:
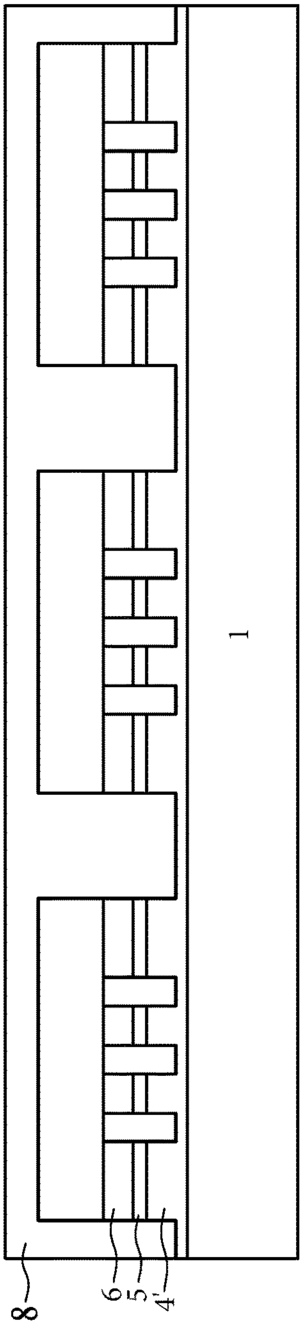
Figure 3G:
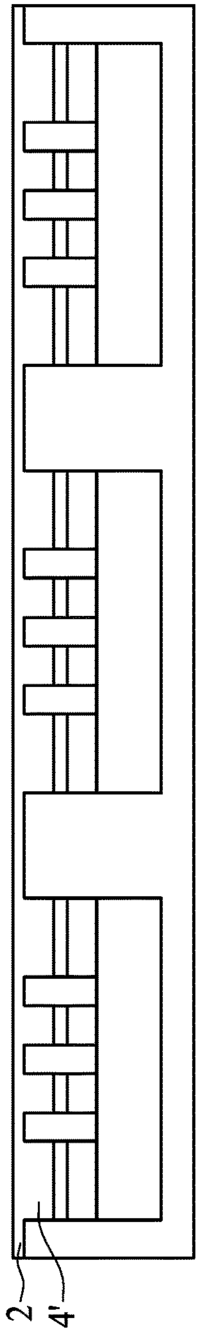

As shown in FIG. 3D, the patterned photoresist layer 3 is removed. As shown in FIG. 3E, a solder material 5 is provided on the patterned conductive layer 4', and a conductive pillar 6 is provided on the solder material 5. A die 7 is attached on the patterned conductive layer 4' through the solder material 5 and the conductive pillar 6. As shown in FIG. 3E, the patterned conductive layer 4' includes a connection pad 41 and a trace 42. As shown in FIG. 3F, the die 7, the patterned conductive layer 4', the solder material 5 and the conductive pillar 6 are encapsulated by an encapsulation layer 8. After the encapsulation layer 8 is formed, the package structure is well suited to withstand handling by humans or machines, even without the carrier 1. As shown in FIG. 3G, the carrier 1 is removed.

Figure 3H:
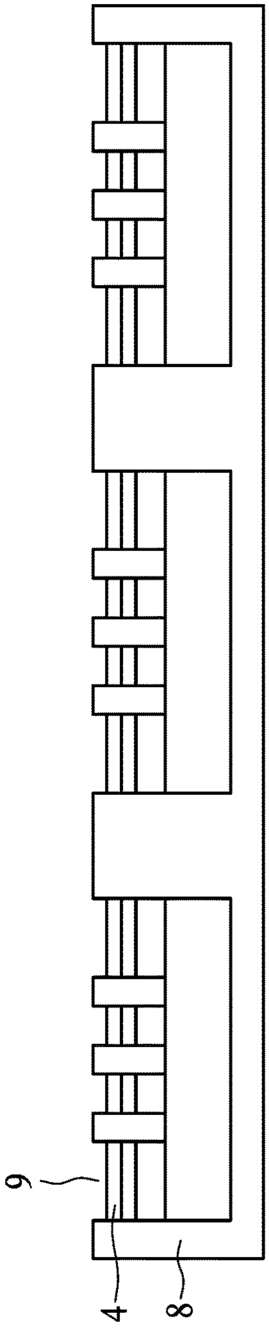

As shown in FIG. 3H, the conductive layer 2 is removed by an etching process. The etching process removes the conductive layer 2 and portions of the patterned conductive layer 4'. The so-etched patterned conductive layer 4' will hereinafter be referred to as a patterned conductive layer 4. An upper surface of the patterned conductive layer 4 is recessed from an upper surface of the encapsulation layer 8, and thus the patterned conductive layer 4 and the encapsulation layer 8 define a recess 9. That is, the upper surface of the patterned conductive layer 4 is disposed lower than the upper surface of the encapsulation layer 8. As will be discussed below, an electrical connection element 11 may be disposed on or in the recess 9. The electrical connection element 11 may thus be constrained by the recess 9 and this can help to prevent the electrical connection element 11 from bleeding or flowing undesirably (e.g. overflowing) in a reflow process. Bleeding or overflowing of the electrical connection element 11 may cause undesired short circuits in a semiconductor device package.

Figure 3I:
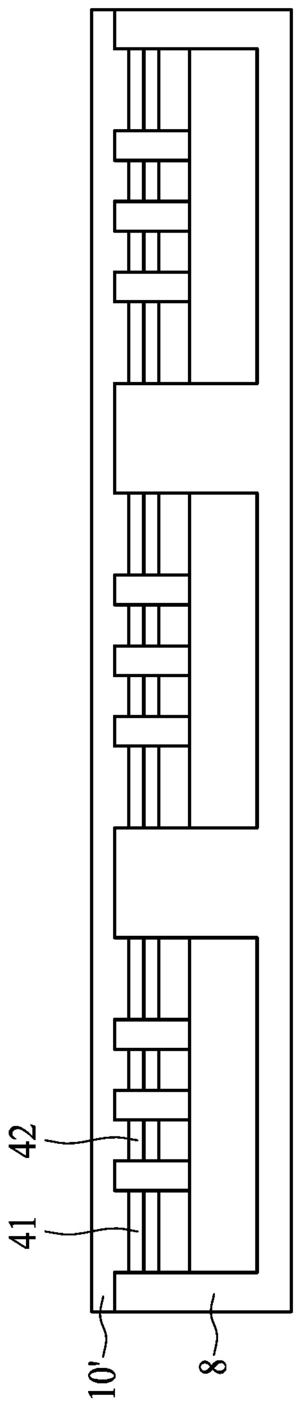

As shown in FIG. 3I, a coating material is disposed on the patterned conductive layer 4 and thus a coating layer 10' is formed. In the embodiments shown in FIG. 3I, the coating layer 10' covers both the connection pad 41 and the trace 42, and covers a surface of the encapsulation layer 8. The coating layer 10' may include hardeners, soldering fluxes and/or solvents. In some embodiments, the coating layer 10' may include a hardener such as an epoxy resin or a bisphenol epoxy resin. In some embodiments, the coating layer 10' may include soldering flux such as a carboxylic acid and/or rosin flux. In some embodiments, the coating layer 10' may include a solvent such as polyglycol or 1-Methyl-2-pyrrolidinone (NMP).

Figure 3J:
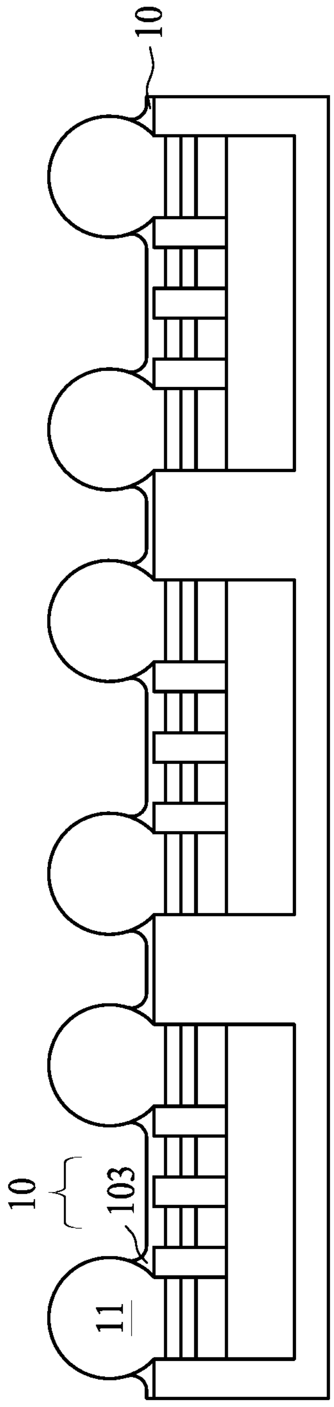

As shown in FIG. 3J, an electrical connection element 11 is formed or disposed on the coating layer 10'. In some embodiments, the electrical connection element 11 may include solder material, for example, tin, another metal, or other suitable material. Subsequent to a reflow operation or a heating operation, the soldering fluxes and solvents of the coating layer 10' are vaporized or otherwise substantially eliminated. In the reflow operation or heating operation, the electrical connection element 11 pushes away the coating material of the coating layer 10' on the connection pad 41 and joins to the connection pad 41, and accordingly a sidewall portion 103 including at least some of the pushed-away coating material is formed to surround the electrical connection element 11. After the reflow operation or heating operation, the electrical connection element 11 is connected to the connection pad 41. After the reflow operation or heating operation, a remainder of the coating layer 10' may constitute a protection layer 10 including the sidewall portion 103, which can include the hardeners of the coating layer 10'. A singulation operation may be performed on the structure shown in FIG. 3J to form a semiconductor die package that is similar to, or the same as, the semiconductor die package 100 as illustrated and described with reference to FIG. 1A.

In the reflow operation or heating operation, the coating layer 10' is hardened to form the protection layer 10 after at least some of the soldering flux and the solvent of the coating layer 10' are volatilized. Therefore, the protection layer 10 may selectively include a hardener such as epoxy resin or bisphenol epoxy resin, and may omit at least some of the soldering flux and the solvent. The protection layer 10 has a thickness in a range of about 70% to about 90% of the thickness of the coating layer 10' (e.g. of the coating layer 10' immediately prior to implementation of the reflow operation or heating operation). In some embodiments, the protection layer 10 disposed on the encapsulation layer 8 has a thickness in a range of about 5 μm to about 15 μm, or a thickness in a range of about 2 μm to about 15 μm. The sidewall portion 103 formed surrounding the electrical connection element 11 may enhance the attachment between the electrical connection element 11 and the connection pad 41. Therefore, the probability that the electrical connection element 11 unintentionally falls off the connection pad 41 can be reduced.

Figure 4A:
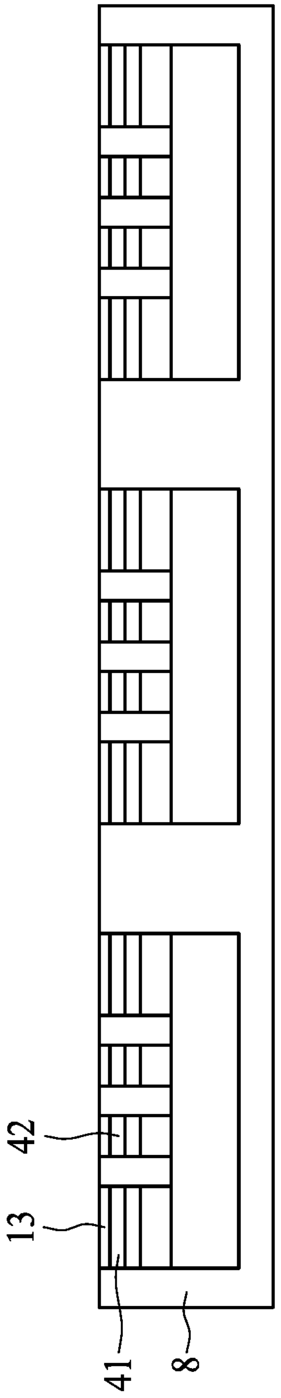
FIG. 4A and FIG. 4B illustrate some stages of a method of manufacturing a semiconductor package according to some embodiments of the present disclosure.
Figure 4B:
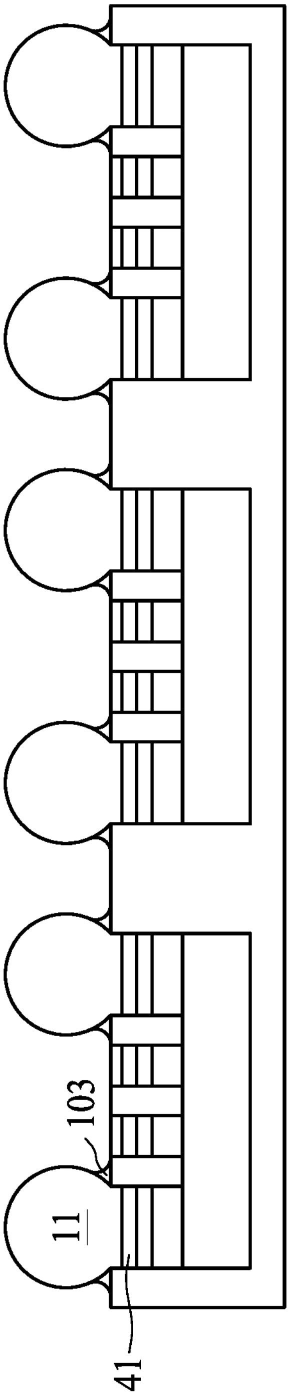

FIG. 4A and FIG. 4B illustrate some stages of a method of manufacturing a semiconductor package according to some embodiments of the present disclosure. The stages of manufacture illustrated in FIG. 4A and in FIG. 4B may be implemented subsequent to the stages of manufacture shown in FIG. 3A, FIG. 3B, FIG. 3C, FIG. 3D, FIG. 3E, FIG. 3F, FIG. 3G, and FIG. 3H.

Referring to FIG. 4A, a coating layer 13 is formed on the patterned conductive layer 4 (e.g. in a recess defined by the patterned conductive layer 4 and the encapsulation layer 8). The coating layer 13 is similar to the coating layer 10' as shown in FIG. 3I, except that the coating layer 13 is formed to selectively cover the patterned conductive layer 4, which includes the connection pad 41 and the trace 42. The encapsulation layer 8 is exposed by the coating layer 13. The coating layer 13 does not cover the encapsulation layer 8.

Referring to FIG. 4B, electrical connection elements 11 are formed or disposed on the coating layer 13. In some embodiments, the electrical connection element 11 may include solder material, for example, tin, another metal, or other suitable material. Subsequent to forming the electrical connection elements 11 on the coating layer 13, a reflow operation or heating operation is performed. Subsequent to a reflow operation or a heating operation, the soldering fluxes and solvents of the coating layer 13 are vaporized or otherwise substantially eliminated. In the reflow operation or heating operation, the electrical connection element 11 pushes away a coating material on the connection pad 41 and joins to the connection pad 41, and accordingly a sidewall portion 103 is formed to surround the electrical connection element 11. Similarly to the process described above in reference to FIG. 3J, after the reflow operation or heating operation, the electrical connection element 11 is connected to the connection pad 41, and a protection layer which includes the hardeners of the coating layer 13 is formed. A singulation operation may be performed on the structure shown in FIG. 4B to form a semiconductor die package similar to, or the same as, the semiconductor die package 120 as illustrated and described with reference to FIG. 1B.

Figure 5A:
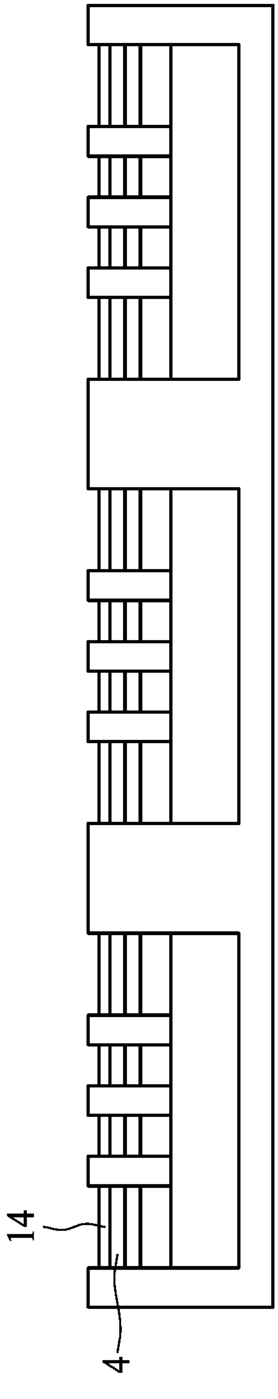
FIG. 5A, FIG. 5B, and FIG. 5C illustrate a method of manufacturing a semiconductor package according to some embodiments of the present disclosure.
Figure 5B:
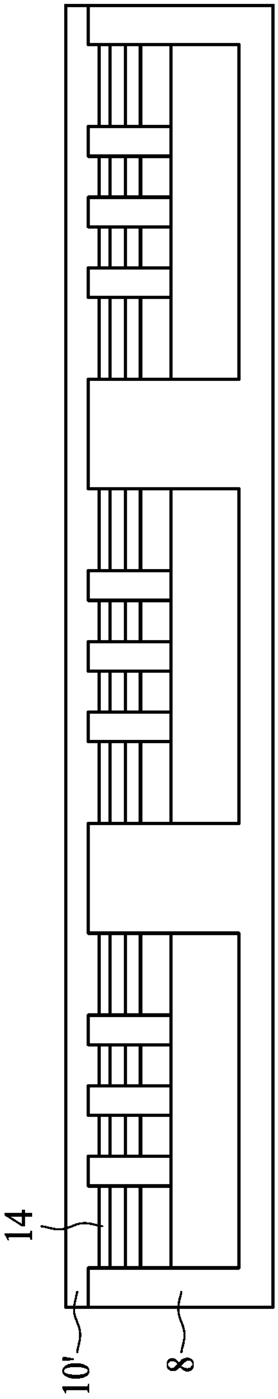
Figure 5C:
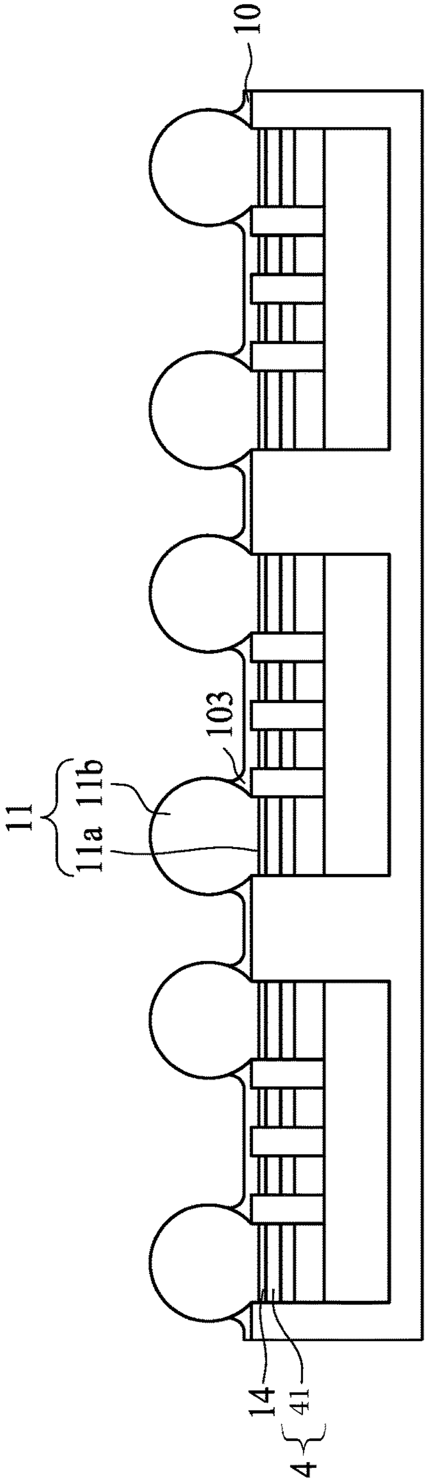

FIG. 5A, FIG. 5B, and FIG. 5C illustrate a method of manufacturing a semiconductor package according to some embodiments of the present disclosure. The stage of manufacture shown in FIG. 5A is a stage that may be performed after the stage of manufacture shown in FIG. 3H. In the stage of manufacture shown in FIG. 5A, an antioxidant conductive layer 14 is formed on the patterned conductive layer 4 (e.g. on a connection pad 41 of the patterned conductive layer 4). In some embodiments, the antioxidant conductive layer 14 includes solder material (which may include tin), electroless nickel immersion gold or other suitable materials. As shown in FIG. 5B, a coating layer 10' is formed on the antioxidant conductive layer 14. In the embodiments shown in FIG. 5B, the coating layer 10' covers both the antioxidant conductive layer 14 and a surface of the encapsulation layer 8. Although not depicted in the drawings, in some embodiments, the coating layer 10' may be selectively disposed on the antioxidant conductive layer 14 and may leave at least a portion of the encapsulation layer 8 exposed.

As shown in FIG. 5C, an electrical connection element 11 is formed or disposed on the antioxidant conductive layer 14. In a reflow operation or heating operation, the electrical connection element 11 pushes away a coating material above the antioxidant conductive layer 14 and joins to the antioxidant conductive layer 14, which may include electroless nickel immersion gold or other suitable materials, and accordingly a sidewall portion 103 is formed to surround the electrical connection element 11. After the reflow operation or heating operation, the electrical connection element 11 is connected to the connection pad 41, and a protection layer 10, which includes the hardeners of the coating layer 10', is formed. A singulation operation may be performed on the structure as shown in FIG. 5C to form a semiconductor die package similar to, or the same as, the semiconductor die package 140 as illustrated and described with reference to FIG. 1C.

Figure 5D:
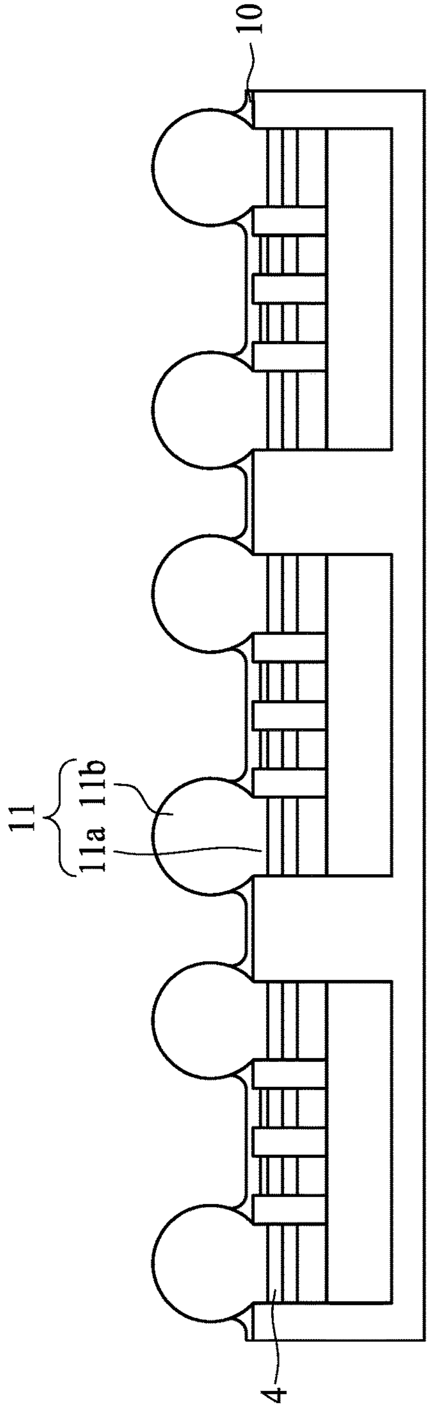
FIG. 5D illustrates a stage of a method of manufacturing a semiconductor package according to some embodiments of the present disclosure.

FIG. 5D illustrates a stage of a method of manufacturing a semiconductor package according to some embodiments of the present disclosure. The stage of manufacture illustrated in FIG. 5D may be implemented, for example, following the stages of manufacture illustrated in FIG. 5A and in FIG. 5B. The stage illustrated in FIG. 5D may be implemented, for example, as an alternative to the stage of manufacture illustrated in FIG. 5C.

As shown in FIG. 5D, an electrical connection element 11 is formed or disposed on the patterned conductive layer 4. In a reflow operation or heating operation, the electrical connection element 11 pushes away the coating material above the patterned conductive layer 4 and joins to the patterned conductive layer 4, and accordingly a sidewall portion 103 is formed to surround the electrical connection element 11. After the reflow operation or heating operation, the electrical connection element 11 is connected to the connection pad 41, and a protection layer 10, which includes the hardeners of the coating layer 10', is formed. A singulation operation may be performed on the structure as shown in FIG. 5D to form a semiconductor die package similar to, or the same as, the semiconductor die package 160 as illustrated and described with reference to FIG. 1D.

Figure 6:
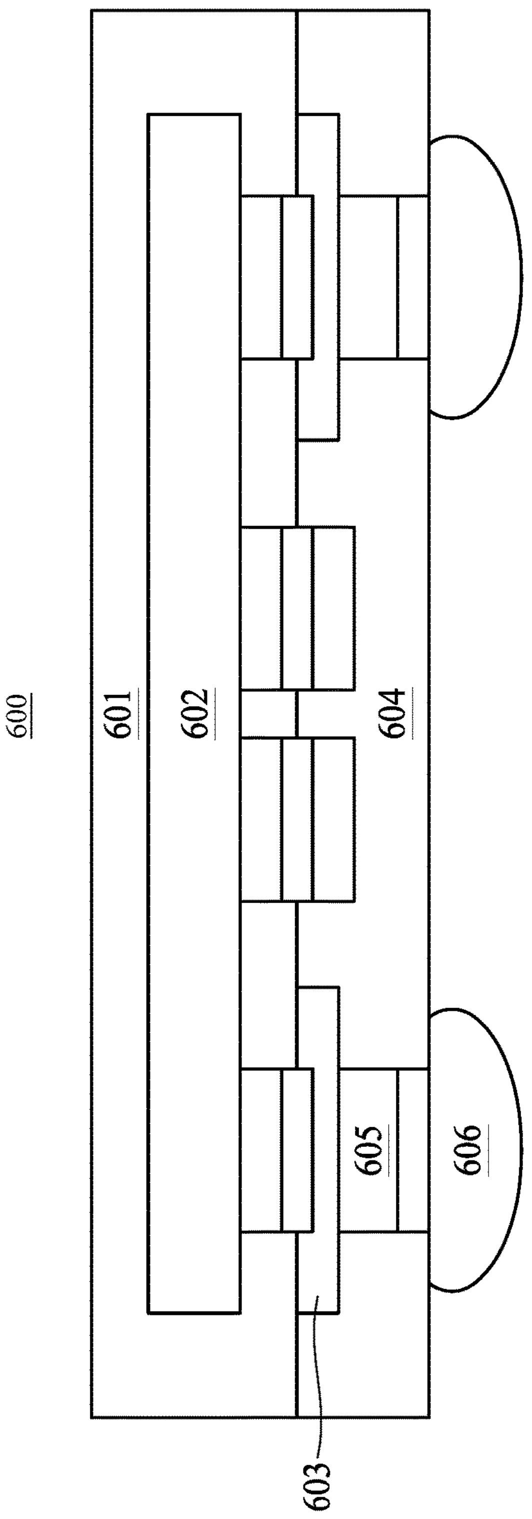
FIG. 6 is a schematic diagram illustrating some embodiments of a semiconductor package.

FIG. 6 is a schematic diagram illustrating some embodiments of a semiconductor package 600. The semiconductor package 600 shown in FIG. 6 includes an encapsulation layer 601, a semiconductor die 602, a patterned conductive layer 603, a substrate 604, one or more conductive pillars 605 and one or more electrical connections 606.

The substrate 604 includes a material similar to, or the same as, a material included in the encapsulation layer 601. In some embodiments, the substrate 604 includes a material different from that included in the encapsulation layer 601. The substrate 604 includes epoxy with fillers. The substrate 604 includes relatively harder material, which may be a thick material, and a thickness thereof is set to be greater than approximately 110 μm to reduce or avoid cracking or other reliability issues. The one or more conductive pillars 605 are formed in the substrate 604 for electrical connection between the semiconductor die 602 and the one or more electrical connections 606. Accordingly, a height of the one or more conductive pillar 605 may be at least about 100 μm, or greater, to help provide for the electrical connection between the one or more electrical components 606 and the patterned metal layer 603. A carrier may be omitted from at least some stages of a manufacturing process of the semiconductor device 600.

Figure 7:
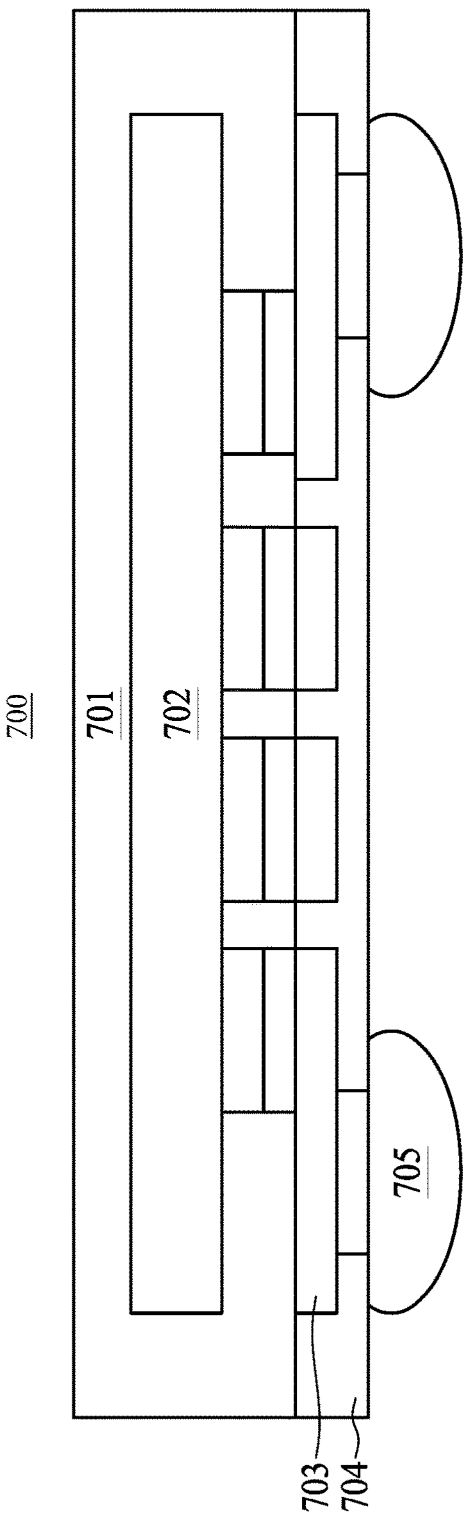
FIG. 7 is a schematic diagram illustrating a comparative example of a semiconductor package.

FIG. 7 is a schematic diagram illustrating a comparative semiconductor package 700. The semiconductor package shown in FIG. 7 includes an encapsulation layer 701, a semiconductor die 702, a patterned conductive layer 703, a dielectric layer 704 and one or more electrical connections 705. The dielectric layer 704 has a thickness equal to, or greater than, approximately 40 μm. The dielectric layer 704 includes a material different from a material included in the encapsulation layer 701. The dielectric layer 704 includes dielectric material, such as (but not limited to) a polyimide (PI), prepreg or pre-impregnated composite fibers (pp), an Ajinomoto build-up film (ABF), an FR-4 grade material, a solder mask and/or other suitable materials. The dielectric layer 704 may function as a protection layer for the patterned conductive layer 703. The dielectric layer 704 may be hygroscopic. The dielectric layer 704 may tend to absorb moisture, which may cause reliability issues. The one or more electrical connections 705 are disposed on the dielectric layer 704 and electrically connected to the patterned conductive layer 703.

Due to a CTE mismatch between the encapsulation layer 701 and the dielectric layer 704, warpage may easily occur during thermal cycles. Moreover, delamination may occur on the boundary or interface between the encapsulation layer 701 and the dielectric layer 704, which include different materials. The embodiments described herein may improve on these deficiencies.

As used herein, the singular terms "a," "an," and "the" may include plural referents unless the context clearly dictates otherwise. In the description of some embodiments, a component provided "on," "above," or "over" another component can encompass cases where the former component is directly on (e.g., in physical contact with) the latter component, as well as cases where one or more intervening components are located between the former component and the latter component.

As used herein, the terms "substantially," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, the term "about" or "substantially" equal in reference to two values can refer to a ratio of the two values being within a range between and inclusive of 0.9 and 1.1

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces can be deemed to be coplanar or substantially coplanar if a displacement between the two surfaces is no greater than 5 μm, no greater than 2 μm, no greater than 1 μm, or no greater than 0.5 μm.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure, as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:

a die;

a patterned conductive layer electrically connected to the die, the patterned conductive layer comprising a connection pad and a trace;

an encapsulation layer encapsulating the die and the patterned conductive layer;

an electrical connection element disposed on the connection pad; and a protection layer comprising a first portion surrounding at least a portion of the electrical connection element, a second portion covering the trace and a third portion covering the encapsulation layer, wherein an upper surface of the second portion is recessed below an upper surface of the third portion and a lower surface of the second portion is recessed below a lower surface of the third portion.

2. The semiconductor package of claim 1, wherein the electrical connection element comprises a first portion and a second portion, and wherein the first portion of the electrical connection element is embedded in the encapsulation layer and the second portion of the electrical connection element is surrounded by the protection layer.

3. The semiconductor package of claim 2, wherein the second portion of the electrical connection element has a hemisphere shape.

4. The semiconductor package of claim 2, wherein:

a first maximum distance between the second portion of the electrical connection element and the patterned conductive layer is a distance X;

a second maximum distance between the first portion of the protection layer and the patterned conductive layer is a distance Y; and the distance Y is less than or equal to about half of the distance X.

5. The semiconductor package of claim 1, wherein the protection layer is disposed against the electrical connection element.

6. The semiconductor package of claim 1, wherein the protection layer is disposed on the patterned conductive layer.

7. The semiconductor package of claim 1, wherein at least a portion of the encapsulation layer is exposed from the protection layer.

8. The semiconductor package of claim 1, wherein the protection layer disposed above the encapsulation layer has a thickness in a range of about 2 micrometers (μm) to about 15 μm.

9. The semiconductor package of claim 1, wherein:

an upper surface of the patterned conductive layer is not coplanar with an upper surface of the encapsulation layer.

10. The semiconductor package of claim 9, wherein an upper surface of the patterned conductive layer is lower than an upper surface of the encapsulation layer, and wherein the protection layer includes a portion embedded in the encapsulation layer.

11. The semiconductor package of claim 1, wherein the protection layer comprises an epoxy resin or a bisphenol epoxy resin.

12. The semiconductor package of claim 1, further comprising an antioxidant conductive layer disposed between the connection pad and the electrical connection element.

13. The semiconductor package of claim 1, wherein the die has a lateral surface and the patterned conductive layer has a lateral surface, and the encapsulation layer covers the lateral surface of the die and the lateral surface of the patterned conductive layer.

14. The semiconductor package of claim 1, further comprising an antioxidant conductive layer disposed on the trace.

15. The semiconductor package of claim 14, wherein the antioxidant conductive layer includes tin (Sn) or electroless nickel immersion gold (ENIG).

16. A method of manufacturing a semiconductor package, comprising:

forming a patterned conductive layer comprising a connection pad and a trace on a carrier;

electrically connecting a die to the patterned conductive layer;

forming an encapsulation layer that encapsulates the die and the patterned conductive layer;

removing the carrier to expose the connection pad of the patterned conductive layer;

forming a coating layer on the connection pad and the trace;

forming an electrical connection element on the coating layer; and heating the coating layer to form a protection layer, the protection layer comprising a first portion surrounding at least a portion of the electrical connection element, a second portion covering the trace and a third portion covering the encapsulation layer, wherein an upper surface of the second portion is recessed below an upper surface of the third portion and a lower surface of the second portion is recessed below a lower surface of the third portion.

17. The method of claim 16, wherein the coating layer comprises a soldering flux and a solvent.

18. The method of claim 17, wherein the soldering flux comprises at least one of carboxylic acid or rosin flux.

19. The method of claim 17, wherein the solvent comprises at least one of polyglycol or 1-Methyl-2-pyrrolidinone (NMP).

20. The method of claim 17, wherein heating the coating layer comprises volatizing the soldering flux and the solvent to harden the coating layer to form the protection layer.

21. The method of claim 20, wherein a thickness of the protection layer is in a range of about 70% to about 90% of a thickness of the coating layer.

22. The method of claim 16, further comprising:

forming an antioxidant conductive layer between the connection pad and the electrical connection element.

23. The method of claim 16, wherein the coating layer comprises at least one of an epoxy resin or a bisphenol epoxy resin.

* * * * *